(12) United States Patent
Wolfs

(10) Patent No.: US 9,041,581 B2
(45) Date of Patent: May 26, 2015

(54) ANALOG-TO-DIGITAL CONVERSION

(71) Applicant: CMOSIS BVBA, Antwerp (BE)

(72) Inventor: Bram Wolfs, Nieuwrode (BE)

(73) Assignee: CMOSIS BVBA, Antwerp (BE)

( * ) Notice: Subject to any disclaimer, the term of this patent is extended or adjusted under 35 U.S.C. 154(b) by 0 days.

(21) Appl. No.: 14/295,267

(22) Filed: Jun. 3, 2014

(65) Prior Publication Data
US 2014/0361916 A1 Dec. 11, 2014

(30) Foreign Application Priority Data

Jun. 10, 2013 (GB) .................................. 1310247.0

(51) Int. Cl.
*H03M 1/36* (2006.01)
*H03M 1/18* (2006.01)

(52) U.S. Cl.
CPC .............. *H03M 1/185* (2013.01); *H03M 1/361* (2013.01)

(58) Field of Classification Search
USPC ......... 341/155, 159, 164, 120; 330/9, 69, 127
See application file for complete search history.

(56) References Cited

U.S. PATENT DOCUMENTS

| 4,359,681 | A * | 11/1982 | Baker et al. ................... 323/320 |
| 7,471,230 | B2 | 12/2008 | Tooyama |
| 7,602,227 | B2 * | 10/2009 | Kim et al. ...................... 327/359 |
| 7,888,995 | B2 * | 2/2011 | Motoyui ........................... 330/9 |
| 8,149,309 | B2 | 4/2012 | Tanaka |
| 8,179,465 | B2 * | 5/2012 | Tanaka .......................... 348/308 |
| 8,233,067 | B2 | 7/2012 | Kondo |
| 8,674,766 | B2 * | 3/2014 | Doany et al. .................. 330/259 |
| 8,797,100 | B2 * | 8/2014 | Balm et al. .................... 330/300 |
| 2011/0279718 | A1 | 11/2011 | Yoo |

FOREIGN PATENT DOCUMENTS

EP 2555509 A1 6/2013

OTHER PUBLICATIONS

Search Report, Appln. No. 1310247.0, Nov. 21, 2013.

* cited by examiner

*Primary Examiner* — Brian Young
(74) *Attorney, Agent, or Firm* — Sulzer, Green & Taylor PLLC

(57) ABSTRACT

An analog-to-digital conversion apparatus 10 comprises a plurality of analog-to-digital converters 30 and a ramp generator 20. Each of the analog-to-digital converters 30 comprises an analog signal input for receiving an analog signal level and a ramp signal input. A control stage is arranged to compare the ramp signal with the analog signal level and, based on the comparison, to enable a counter provided at the analog-to-digital converter or to latch a digital value received from a counter. The control stage comprises a comparator in the form of a first differential amplifier with a first branch connected to the input for receiving the ramp signal, a second branch connected to the analog signal input and an output, and a biasing current source for biasing the first differential amplifier. A feedback circuit controls the biasing current source. The feedback circuit comprises a second differential amplifier OP1 with a first input connected to a node 46 on the first branch and a second input connected to a reference voltage VB such that the node on the first branch is maintained at a substantially constant voltage.

16 Claims, 11 Drawing Sheets

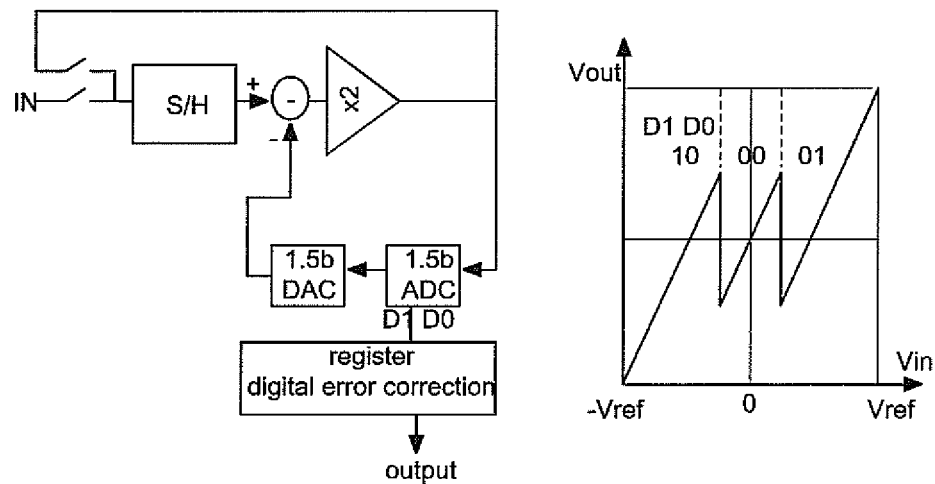
Fig.11A
Fig. 11B
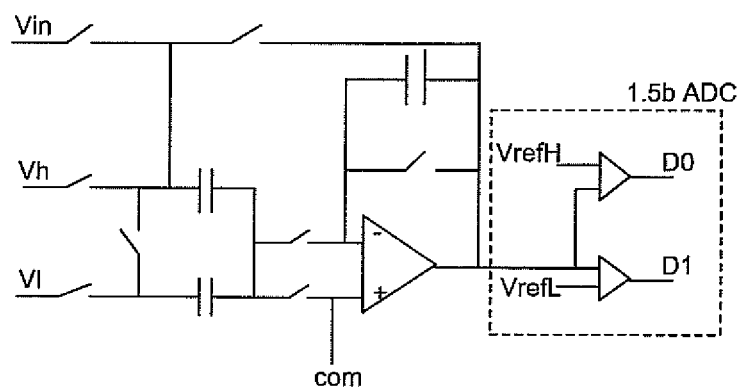
Fig. 11C

ANALOG-TO-DIGITAL CONVERSION

CROSS-REFERENCE TO RELATED APPLICATION

This application claims the benefit of priority of the filing date of British Patent Application 1310247.0 filed on Jun. 10, 2013, which is incorporated herein by reference.

TECHNICAL FIELD

This invention relates to an analog-to-digital conversion apparatus and a method of performing analog-to-digital conversion which can be used, for example, to convert analog signal levels output from a pixel array of an image sensor.

BACKGROUND OF THE INVENTION

Image sensors comprise an array of unit elements, called pixels. The array of pixels is exposed to radiation during an exposure period and, subsequently, the signal value of each pixel is read from the array.

Various arrangements have been proposed where analog-to-digital conversion is performed, in parallel, for analog signal values read from columns of the array.

FIG. 1 shows an analog-to-digital conversion apparatus 10 comprising a ramp generator 20 and a plurality of analog-to-digital converters 30. Only two analog-to-digital converters 30 are shown in FIG. 1 but, in practice, the number of analog-to-digital converters 30 can be much higher. For example, a pixel array may have several thousand columns. The ramp generator 20 is arranged to generate a ramp signal Vramp which is distributed to the converters 30. Each analog-to-digital converter 30 has a comparator which is arranged to compare the ramp signal Vramp with an analog signal level ADC_IN[0], ADC_IN[1]. Each comparator has a respective output COMP_OUT[0], COMP_OUT[1]. Each analog-to-digital converter 30 also comprises a counter (not shown) which is enabled for a period of time based on the comparator output COMP_OUT[0], COMP_OUT[1]. For example, the time period between the falling edge of RESET and the rising edge of COMP_OUT can be a measure of the signal level ADC_IN. This time period can be translated to a digital number by the digital counter which is active during this period.

FIG. 2 shows what happens when two different analog voltage levels are converted by analog-to-digital converters 30 which share the same ramp signal Vramp. When the ramp signal Vramp approaches the value of the analog signal level ADC_IN[0], COMP_OUT[0] toggles and an offset appears on the ramp signal Vramp. Then, when the ramp signal Vramp approaches the value of the analog signal level ADC_IN[1], COMP_OUT[1] toggles and an additional offset is added to the ramp signal Vramp. The analog-to-digital conversion of signal ADC_IN[1] is influenced by the A/D conversion of signal ADC_IN[0]. The dashed line in FIG. 2 shows the correct value of Vramp. It can be seen that the time period Tcount[1] is longer than it should be, due to the influence that the first comparator had on the ramp signal Vramp.

The present invention seeks to provide an analog-to-digital conversion apparatus with improved accuracy.

SUMMARY OF THE INVENTION

An aspect of the invention provides an analog-to-digital conversion apparatus comprising:
a plurality of analog-to-digital converters;
a ramp generator which is arranged to generate a ramp signal for distribution to the plurality of analog-to-digital converters;
wherein each of the analog-to-digital converters comprises:
an analog signal input for receiving an analog signal level;
a ramp signal input for receiving the ramp signal;
a control stage which is arranged to compare the ramp signal with the analog signal level received at the analog signal input and, based on the comparison, to enable a counter provided at the analog-to-digital converter or to latch a digital value received from a counter, the control stage comprising:
a comparator in the form of a first differential amplifier with a first branch connected to the input for receiving the ramp signal, a second branch connected to the analog signal input and an output;
a biasing current source for biasing the first differential amplifier;
a feedback circuit for controlling the biasing current source, wherein the feedback circuit comprises a second differential amplifier with a first input connected to a node on the first branch and a second input connected to a reference voltage such that the node on the first branch is maintained at a substantially constant voltage.

An advantage of an embodiment is reduced distortion caused by each of the comparators to the ramp input signal. Operation of a comparator in one of the analog-to-digital converters has a reduced, or negligible, effect on the ramp signal which is used by other ones of the analog-to-digital converters. This reduction in distortion can provide an improved accuracy of the analog-to-digital conversion.

Advantageously, the first branch of the first differential amplifier comprises a first transistor connected in series with a second transistor, with the ramp signal input connected to a gate of the first transistor, and wherein the node on the first branch is between the first transistor and the second transistor.

Advantageously, the second branch of the first differential amplifier comprises a third transistor connected in series with a fourth transistor, with the analog signal input connected to the third transistor, and wherein the output of the comparator is taken from a node on the second branch between the third transistor and the fourth transistor.

Advantageously, the analog-to-digital conversion apparatus further comprises additional gain stages connected to the output of the first differential amplifier.

Advantageously, the additional gain stages comprise: a second gain stage comprising a second gain stage transistor in series with a second gain stage current source; a third gain stage comprising a third gain stage transistor in series with a third gain stage current source; wherein an output of the first differential amplifier is connected to a gate of the second gain stage transistor and wherein the second gain stage is connected to a gate of the third gain stage transistor.

Advantageously, the analog-to-digital conversion apparatus further comprises a reference circuit for providing the reference voltage, the reference circuit comprising a reference circuit current source, and wherein current values of the current sources are arranged such that a current value of the third gain stage current source is substantially twice a current value of the reference circuit current source, and a current value of the second gain stage current source is substantially equal to a current value of the reference circuit.

Advantageously, the first branch and the second branch of the first differential amplifier comprise additional series connected transistors.

Advantageously, the first differential amplifier comprises a folded cascade amplifier.

Advantageously, the analog-to-digital conversion apparatus further comprises a reference circuit with a reference circuit current source in series with a reference circuit transistor, wherein the second input of the second differential amplifier connects to a node of the reference circuit between the reference circuit current source and the reference circuit transistor.

Advantageously, the second differential amplifier is an operational amplifier.

Advantageously, the analog signal input is arranged to receive a first analog signal level and a second analog signal level, and wherein the control stage is arranged to enable the counter based on a comparison of the ramp signal with the first analog signal level and the second analog signal level.

Advantageously, the control stage is arranged to generate a digital output value which is representative of a difference between the first analog signal level and the second analog signal level.

Advantageously, the first analog signal level is a reset level of a pixel and the second analog signal level is a signal level of the pixel following exposure.

Advantageously, the control stage is arranged to enable the counter based on at least one of a start of a cycle of the ramp signal and an end of a cycle of the ramp signal.

Another aspect provides an image sensor comprising an array of pixels and an analog-to-digital conversion apparatus. Each of the plurality of analog-to-digital converters in the analog-to-digital conversion apparatus is associated with a group of pixels in the array of pixels.

Another aspect provides a method of performing analog-to-digital conversion at an analog-to-digital conversion apparatus comprising a plurality of analog-to-digital converters, the method comprising:
generating a ramp signal and distributing the ramp signal to the plurality of analog-to-digital converters;
and further comprising, at each of the analog-to-digital converters:
receiving an analog signal level;
receiving the ramp signal;
comparing the ramp signal with the analog signal level and, based on the comparison, enabling a counter provided at the analog-to-digital converter or latching a digital value received from a counter, wherein the comparison is performed by a comparator in the form of a first differential amplifier with a first branch connected to the input for receiving the ramp signal, a second branch connected to the analog signal input and an output;
and the comparing further comprises biasing the first differential amplifier and controlling the biasing by a feedback circuit comprising a second differential amplifier with a first input connected to a node on the first branch and a second input connected to a reference voltage such that the node on the first branch is maintained at a substantially constant voltage.

The pixel array and/or the analog-to-digital conversion apparatus can be manufactured using a technology such as Complementary Metal Oxide Semiconductor (CMOS).

The pixel array can be a one dimensional array (linear sensor) or a two dimensional array (area array) of pixels.

Advantageous features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which:

FIGS. 11A to 11C show a cyclic ADC;

DETAILED DESCRIPTION OF THE INVENTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Throughout this specification, it should be noted that the term "row" and "column" can be interchanged. Also, the term "row" does not imply a particular orientation of the array.

Figure 1:
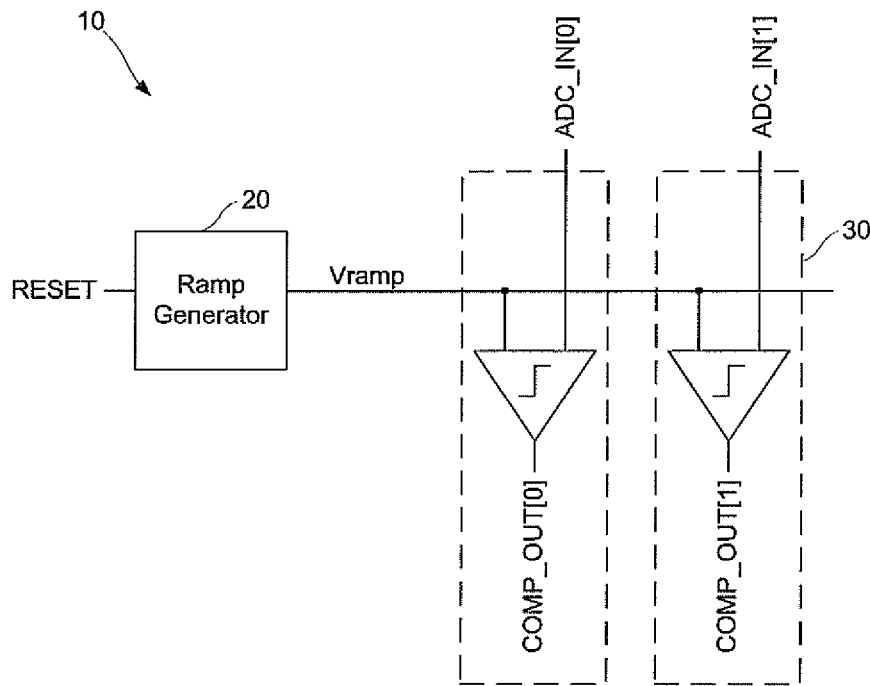
FIG. 1 shows an analog-to-digital conversion apparatus with a plurality of circuits, each for receiving an analog signal level.
Figure 2:
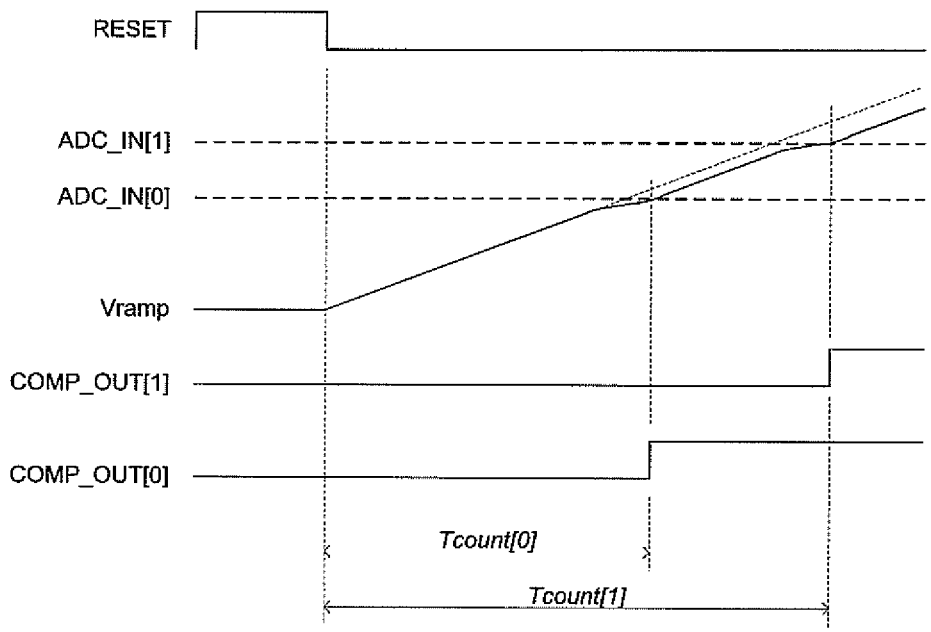
FIG. 2 shows operation of the conversion apparatus of FIG. 1.
Figure 3A:
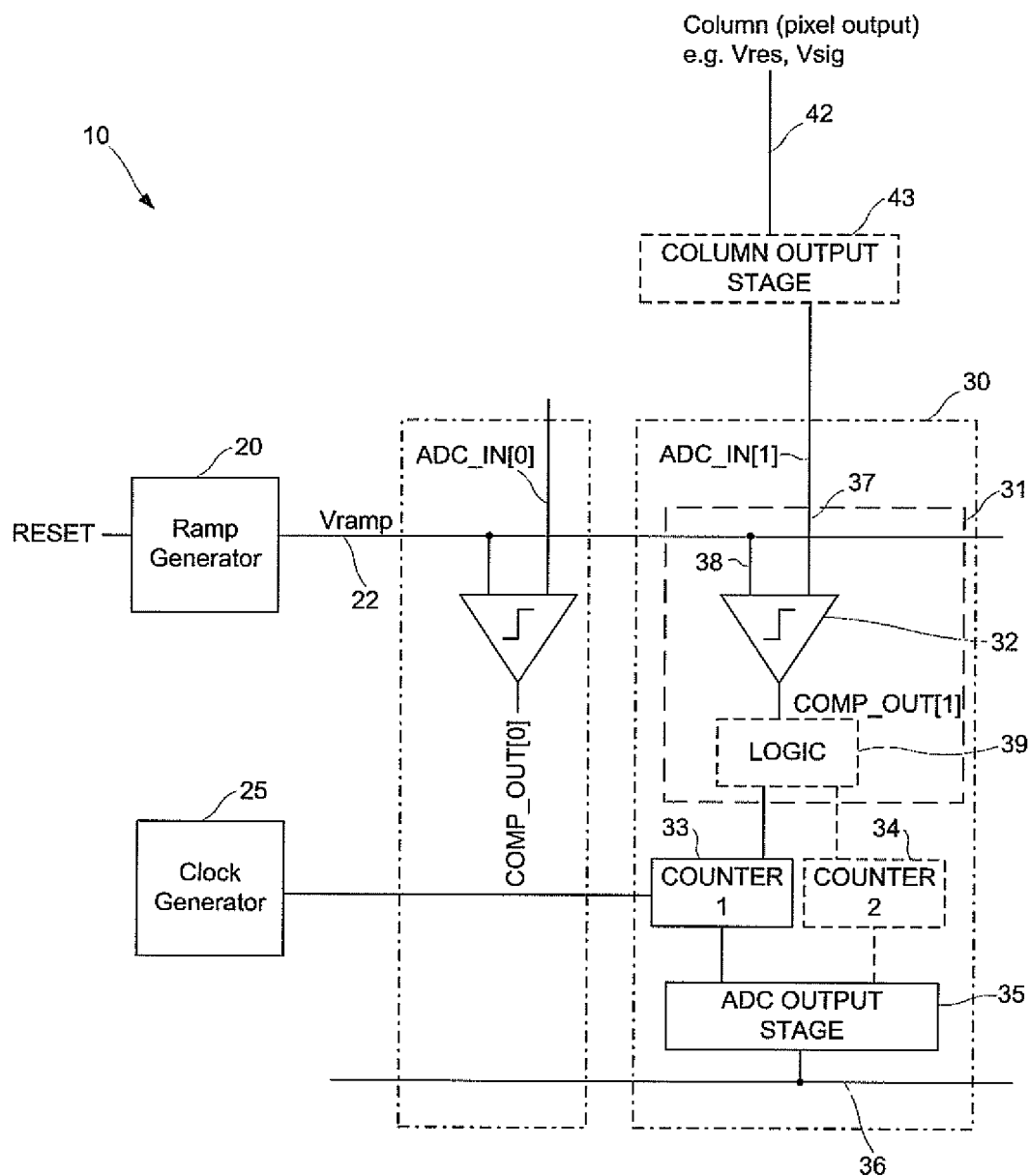
FIGS. 3A and 3B show an analog-to-digital conversion apparatus according to embodiments.
Figure 3B:
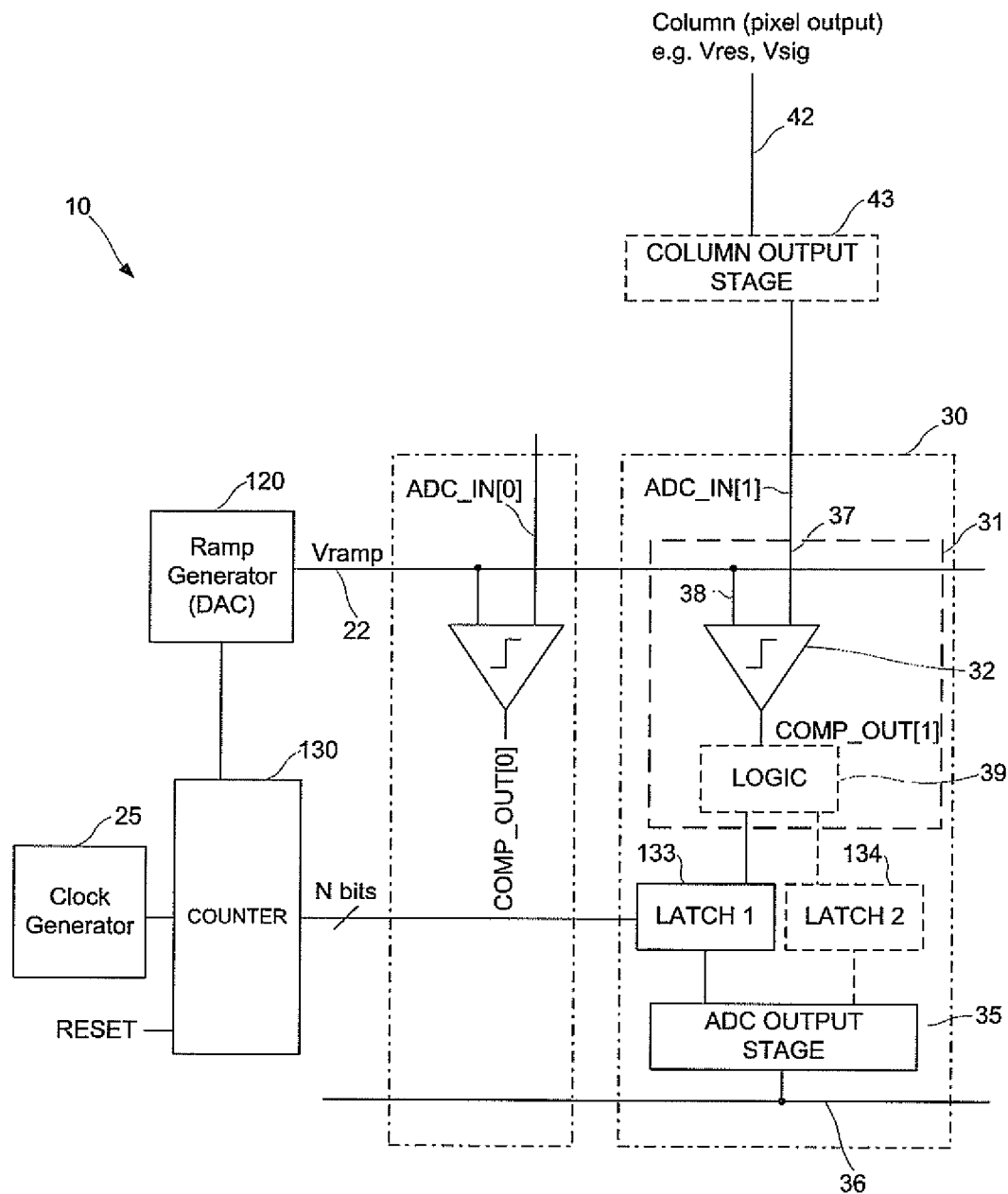

FIGS. 3A and 3B show analog-to-digital conversion apparatus 10 which can be used for analog-to-digital conversion of outputs of a pixel array. An analog-to-digital converter 30 is provided for each column of the pixel array. One of the analog-to-digital converters 30 is shown in detail. The set of analog-to-digital converters 30 can be operated in parallel with one another, thereby increasing the speed at which data can be read from the pixel array.

In the apparatus of FIG. 3A at least one counter 33 is provided at each analog-to-digital converter 30. A ramp signal Vramp and a clock signal is distributed to the set of analog-to-digital converters 30. In the apparatus of FIG. 3B a counter 130 generates a digital counter signal (e.g. an N bit counter signal) which is distributed to the set of analog-to-digital converters 30. A ramp signal Vramp is also distributed to the set of analog-to-digital converters 30. Each analog-to-digital converter 30 has a latch 133, or multiple latches 133, 134 for latching a value of the distributed counter signal.

Each of the analog-to-digital converters 30 may receive one analog signal level per pixel or it may receive two analog signal levels per pixel from the column output bus 42 of a pixel array. In the case of two analog signal levels per pixel, the two analog signal levels can be a reset voltage, Vres, and a signal voltage, Vsig. The reset voltage is a voltage of a pixel following reset. The signal voltage is a voltage of a pixel following exposure to light during an exposure period. Each of the analog-to-digital converters 30 may convert each of these signals to a digital value, or it may convert a difference between the two analog signals, Vres and Vsig, to a digital value. Analog values read from a pixel can be stored in a column output stage 43, such as a sample-and-hold stage.

A ramp generator 20 generates a ramp signal which is distributed to the analog-to-digital converters 30. The set of analog-to-digital converters 30 are connected to a common node 22.

A clock generator 25 generates at least one clock signal which is distributed to the analog-to-digital converters 30. Each analog-to-digital converter 30 uses the ramp signal and the clock signal to perform analog-to-digital conversion.

The analog-to-digital converter 30 comprises at least one input 37 for receiving an analog signal level ADC_IN[1] and an input 38 for receiving the ramp signal Vramp. There is also an input for receiving at least one clock signal. A control stage 31 of the analog-to-digital converter 30 comprises comparator 32. The comparator 32 compares the analog signal level on input 37 with the ramp signal Vramp on input 38 and generates an output signal COMP_OUT[1]. In a simplest embodiment, the comparator output COMP_OUT[1] is applied directly to a counter 33, to enable the counter 33. In other embodiments, there can be additional logic 39 between the comparator and one or more counters 33, 34.

The control stage 31 can also arranged to enable the counter 33, or counters 33, 34, based on at least one of: a start of a cycle of the ramp signal and an end of a cycle of the ramp signal. A dedicated control signal (not shown) can be distributed to the column ADC counters 33, 34 and to the logic 39 of the control stage 31. This control signal indicates when the ramp signal is active.

The counter 33 accumulates a count of clock pulses during a period in which it is enabled and outputs a digital value equal to this count. The counter 33 can be a uni-directional counter (i.e. a counter which only counts in an upward direction, or a counter which only counts in a downward direction) or counter 33 can be a bi-directional counter (i.e. a counter which selectively counts in an upward direction and a downward direction). An output of the counter 33 is applied to an ADC output stage 35. Output stage 35 can selectively output a digital value to an output bus 36. In other embodiments, the output stage 35 may comprise an adder, subtractor, or other logic to perform an operation on outputs of the counter 33, or multiple counters 33, 34. Output stage 35 can include storage (e.g. Static Random Access Memory, SRAM).

The apparatus of FIG. 3B operates in a similar manner to that of FIG. 3A. The counter 130 is incremented in synchronism with the ramp signal Vramp such that, at any point in time, the counter 130 provides a digital representation of the analog value of the ramp signal Vramp output by the ramp generator 120. The comparator 32 in each column ADC 30 compares the level of the input signal (e.g. Vres or Vsig) against the gradually changing ramp signal Vramp. When the ramp voltage Vramp reaches the value of the input signal voltage, the output of the comparator 32 changes state and latches the digital value of the counter 130 into a memory of the ADC output stage 35. The same process can be repeated for the other of the signals (Vres, Vsig) and the digital value latched into a memory of the ADC output stage 35. Each of the stored digital values, or a difference between the stored digital values, is output by the ADC output stage 35 to the output bus 36.

Figure 4:
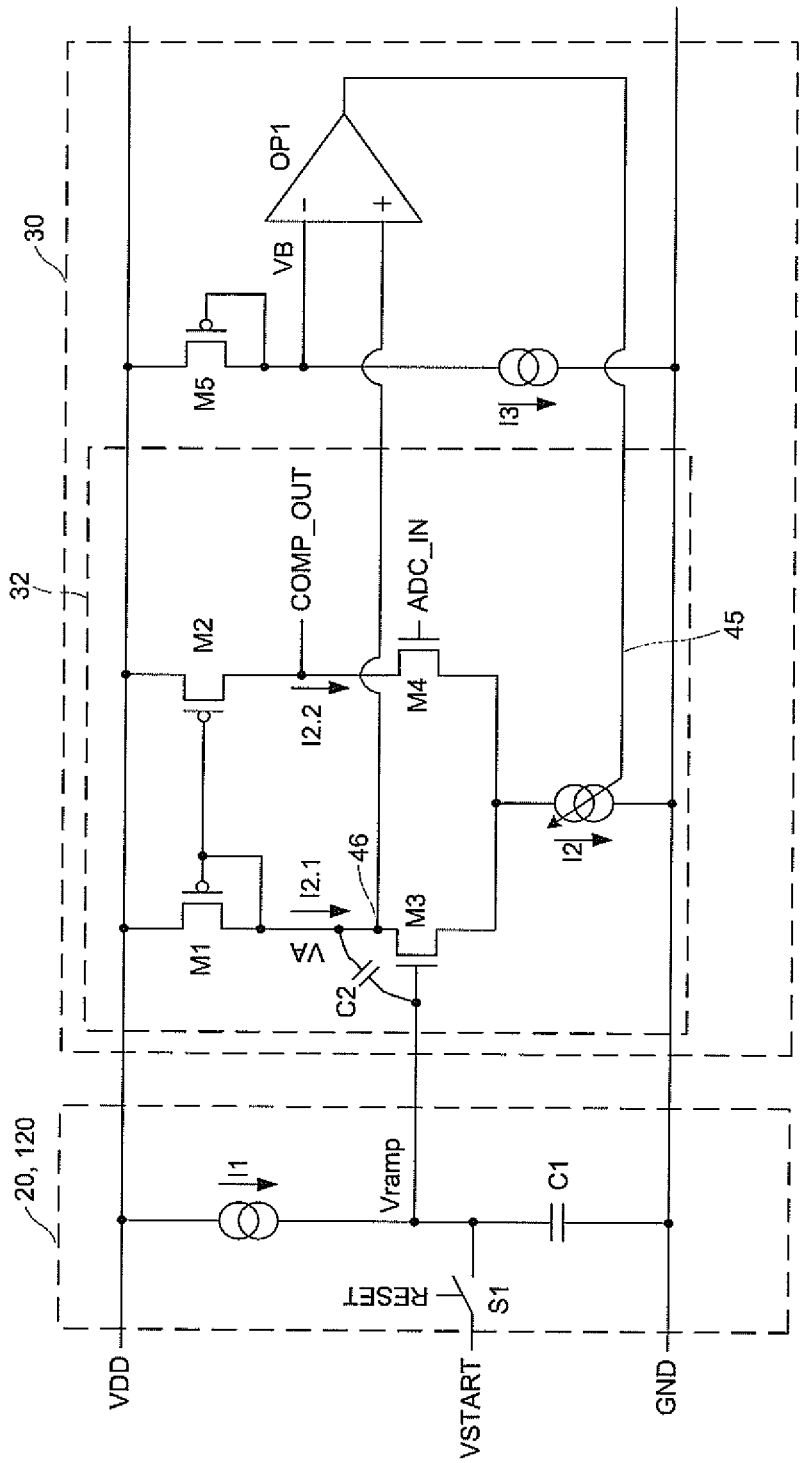
FIG. 4 shows a comparator used within the apparatus of FIG. 3A or 3B.

FIG. 4 shows analog-to-digital conversion apparatus according to an embodiment of the invention in more detail. The ramp generator 20, 120 is shown on the left-hand side of FIG. 4. This circuit generates a linearly increasing voltage signal, called the ramp voltage Vramp. When switch S1 is conducting, voltage Vramp will be kept at the same level as VSTART, which is a reference voltage. When switch S1 is toggled to a non-conducting state, the current delivered by current source I1 is integrated on capacitor C1. The signal Vramp will increase linearly with a slope determined by the current I1. In general, the ramp generator 20 can be any circuit which generates a linear ramp-like signal which can be distributed to converters 30 for comparison with analog signal levels.

The right-hand side of FIG. 4 shows the comparator 32 forming part of one of the analog-to-digital converters 30. Each of the analog-to-digital converters 30 can have the same circuit topology. The comparator 32 comprises a first differential pair amplifier with transistors M1-M4. A first branch of the differential pair amplifier comprises the transistors M1 and M3 arranged in series. A second branch of the differential pair amplifier comprises the transistors M2 and M4 arranged in series. The ramp signal Vramp is applied to the gate of transistor M3 of the first branch. The analog signal level ADC_IN is applied to the gate of transistor M4 of the second branch. An output signal COMP_OUT is taken from a node on the second branch of the differential pair amplifier between M2 and M4. The bias current of the differential pair amplifier is controlled by current source I2.

Current source I2 can vary in value, in response to a feedback signal 45. The feedback circuit comprises a differential amplifier which, in FIG. 4, is an operational amplifier (OPAMP) OP1. Transistor M5 and current source I3 form a reference circuit to provide a stable reference voltage VB. The reference voltage VB can be generated in any other suitable way.

Differential amplifier OP1 has a first input which is connected to the first branch of the differential amplifier, at a node 46 between the series-connected transistors M1, M3. The first input receives a voltage VA. Amplifier OP1 has a second input which is connected to the reference circuit at a node between transistor M5 and current source I3. The second input receives a voltage VB.

In an embodiment, transistors M1 and M5 can be matched (i.e. have the same design parameters). Current source I3 is biasing transistor M5. The voltage VB is determined by the design parameters of M5 and the current I3. Signals VB and VA are connected to the inputs of OP1, while the output 35 of OP1 is controlling the current I2 in a feedback loop. This feedback loop will set the current I2 such that signal VA is always equal to signal VB.

Figure 5:
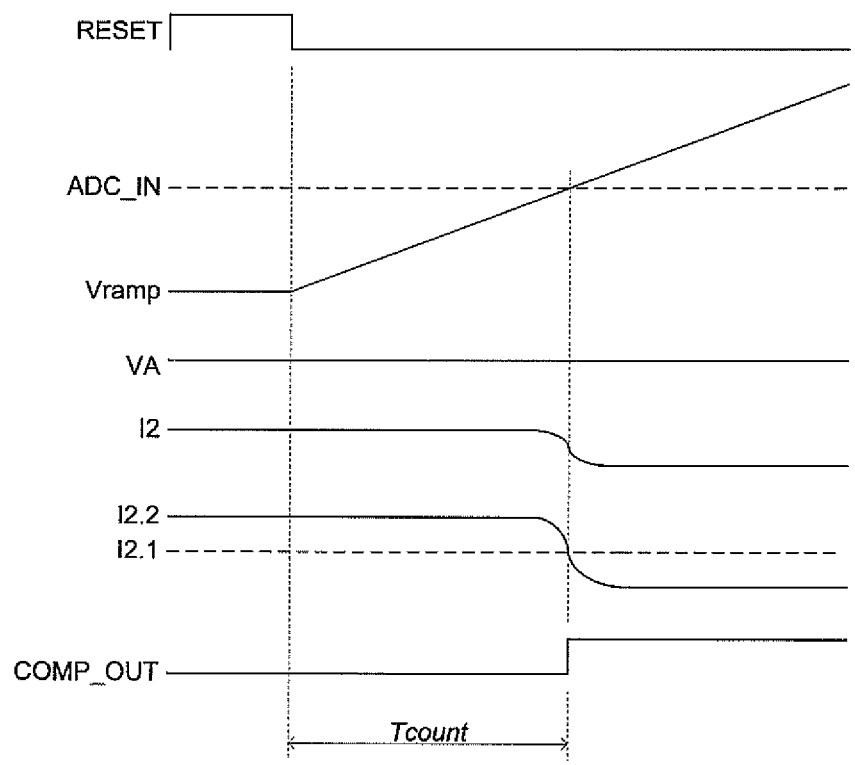
FIG. 5 shows operation of the comparator of FIG. 4.

FIG. 5 shows the timing of the circuit shown in FIG. 4. Initially, the RESET signal is high which means that the switch S1 is conducting. Next, the RESET signal is set low to start the linear rise of the Vramp signal. As long as the Vramp signal level is lower than the ADC_IN signal, the output signal of the comparator, COMP_OUT, will be low. When the Vramp signal level becomes higher than the ADC_IN signal level, the output signal COMP_OUT goes to the high state. The time between the falling edge of RESET and the rising edge of COMP_OUT is a measure for the signal level ADC_IN. This time can be translated to a digital number by a digital counter which is active during this period. When the ramp signal Vramp is lower than ADC_IN, comparator output signal COMP_OUT is low and current I2.2 is larger than current I2.1. As the ramp signal Vramp reaches the level of the analog input signal ADC_IN, and crosses the value of ADC_IN, current I2.2 will drop, but current I2.1 remains unchanged due to the feedback loop and feedback signal 45 applied to current source I2. Voltage VA remains unchanged and therefore the Vramp signal is not affected, regardless of the state of the comparator. This means that the analog-to-digital conversion performed by one of the plurality of comparators 32 does not influence the analog-to-digital conversion of another one of the comparators 32 and, therefore, the analog-to-digital conversion of analog values read from the pixel array is more accurate.

In the absence of the feedback circuit, it has been found that when the ramp signal Vramp is close to the ADC_IN level, the voltage on circuit node VA will drop because the current I2.1 through transistor M3 is increasing. The current I2.2 decreases such that the sum of both currents I2.1 and I2.2 is always equal to current I2. Due to the presence of a parasitic capacitor, C2, this voltage drop on VA distorts the Vramp signal and, for a short period, the slope of the ramp signal Vramp will be lowered. This causes an offset in Vramp due to the toggling of the comparator.

Referring again to FIG. 4, a purpose of M5 is to ensure that the VB voltage is at the correct bias level. Because the feedback loop ensures VA=VB, this also sets the value of voltage VA. Therefore, M5 can set the bias level for transistor M1 (gate and source are at VA, and drain is at VDD). This bias determines the current through M1. This current also flows though I2 at the moment when Vramp>>ADC_IN. If M5 and M1 are equal in size, this current I2 will be exactly the same as I3, since both M5 and M1 will conduct the same current I3 as well.

The comparator (differential amplifier) 32 is designed by selecting appropriate dimensions for M3 and M4, and the current I2. These parameters determine the gain and speed of the comparator 32. With the circuit shown in FIG. 4, the designer will set the current through I2 by choosing I2 and M5. If M5 is equal in size to M1, then I3 will be set at the design value for I2.

A designer may want to change the dimensions of M5 and M1, to save some power. For example, if M5 has only half the width of M1 and the same length, then the current through M5 is only half of the current through M1. This can save some power, as the current I3 is only half. Total power consumption of the comparator (excluding the ramp generator 20) is VDD* (I2+I3).

Figure 6:
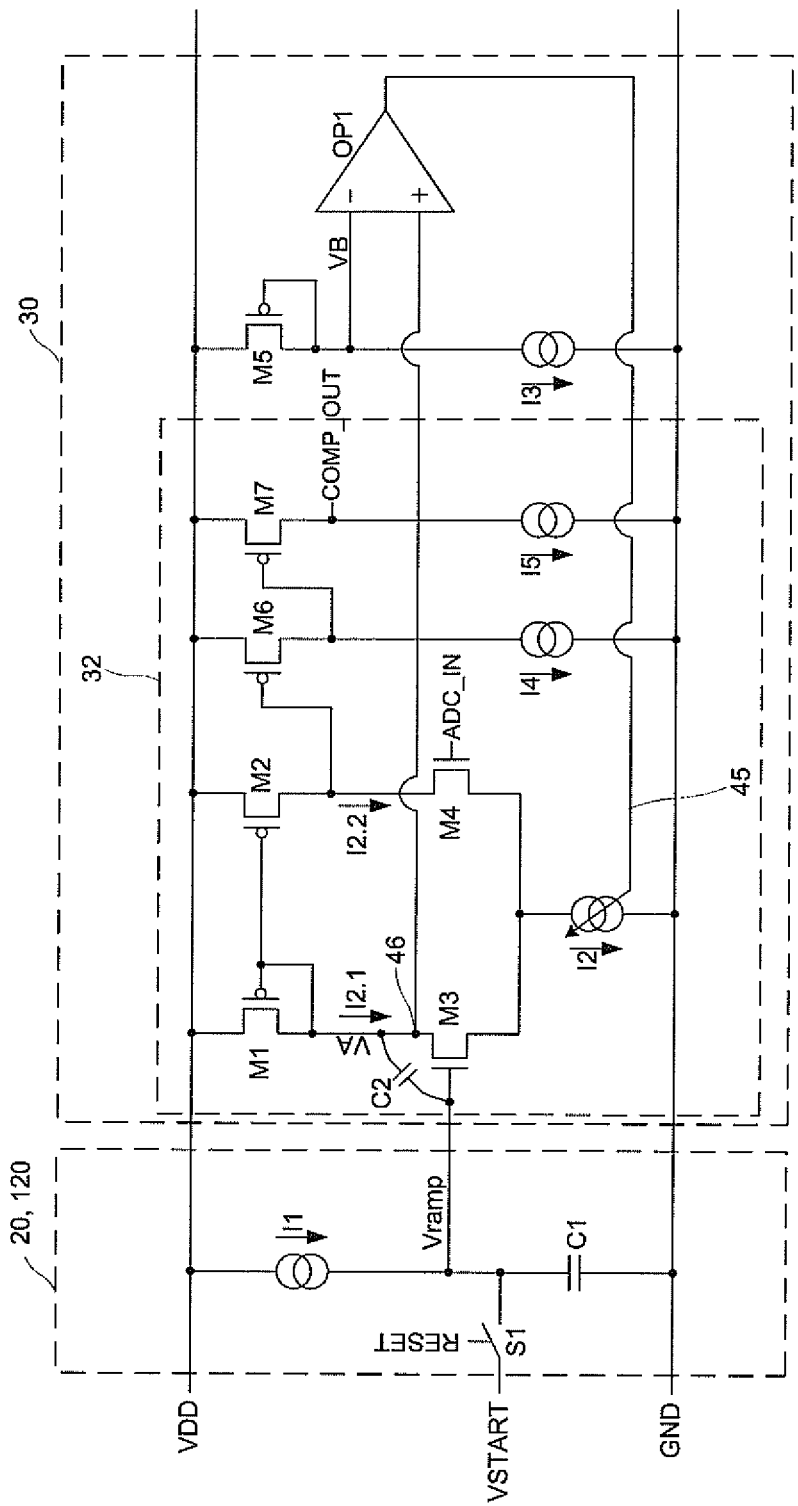
FIGS. 6 to 8 show other comparators for use within the apparatus of FIG. 3A or 3B.

FIG. 6 shows a comparator circuit according to another embodiment of the invention. Additional gain stages are added to the differential amplifier. A second gain stage and a third gain stage are added to the differential amplifier. The second gain stage comprises a second gain stage transistor M6 in series with a second gain stage current source I4. The third gain stage comprises a third gain stage transistor M7 in series with a third gain stage current source I5. An output of the differential amplifier is connected to a gate of the second gain stage transistor M6 and the second gain stage is connected to a gate of the third gain stage transistor M7. A node between the second gain stage transistor M6 and the second gain stage transistor I4 is connected to the gate of the third gain stage transistor M7. The current I4 will only flow while ADC_IN is lower than Vramp, since in this case only M6 is conducting. The current I5 will only flow when ADC_IN is higher than Vramp, since in this case only M7 is conducting. Advantageously, the current value of current source I4 is chosen to be substantially equal to I3 and the current value of current source I5 is chosen to be substantially double the current value of current source I3. As such, the total current drawn by the circuit is independent of the state of the comparator output.

For the circuit of FIG. 6, the total current through all of the branches is constant, independent of the input state of the comparator. The table below shows the current through each current source for the two different states of the input, i.e. a first state where the analog voltage ADC_IN>Vramp, and a second state where the analog voltage ADC_IN<Vramp. Current through I2 is adjusted by feedback. When ADC_IN<<Vramp, then all current provided by the biasing current source I2 flows through M3, and M4 does not conduct current. The feedback ensures that current I2 is equal to I3.

When ADC_IN>Vramp, then the current provided by the biasing current source I2 flows through both branches. The feedback loop ensures that current I3 flows through M3. When ADC_IN>Vramp, this current also flows through M4 because of the current mirror formed by M1 and M2. M4 pulls the node at the drain of M2 and M4 to a low potential. Current I4 flows when ADC_IN>Vramp. Only in that condition M6 is switched on and current I4 flows permanently. When ADC_IN<Vramp, M6 is off and current I4 disappears after pulling the drain of M6 is ground. Conversely, current I5 only flows when ADC_IN<Vramp. Advantageously, current I5 is set to 2×I3.

| | Branch | | | | | | |
|---|---|---|---|---|---|---|---|
| | I2 | I2.1 | I2.2 | I3 | I4 | I5 | Total current |
| Current setting | Adjusted by feedback | | | I3 | I3 | 2 × I3 | |
| ADC_IN > Vramp | 2 × I3 | I3 | I3 | I3 | I3 | 0 | 4 × I3 |
| ADC_IN < Vramp | I3 | I3 | 0 | I3 | 0 | 2 × I3 | 4 × I3 |

The table above indicates to which current levels the current sources I4 and I5 can be set to guarantee a continuous, state-independent, current consumption for the comparator.

In the example described above the comparator output goes high when Vramp>ADC_IN. The output of the comparator can be inverted, if required, by an inverter forming part of the logic 39, FIGS. 3A, 3B.

Figure 7:
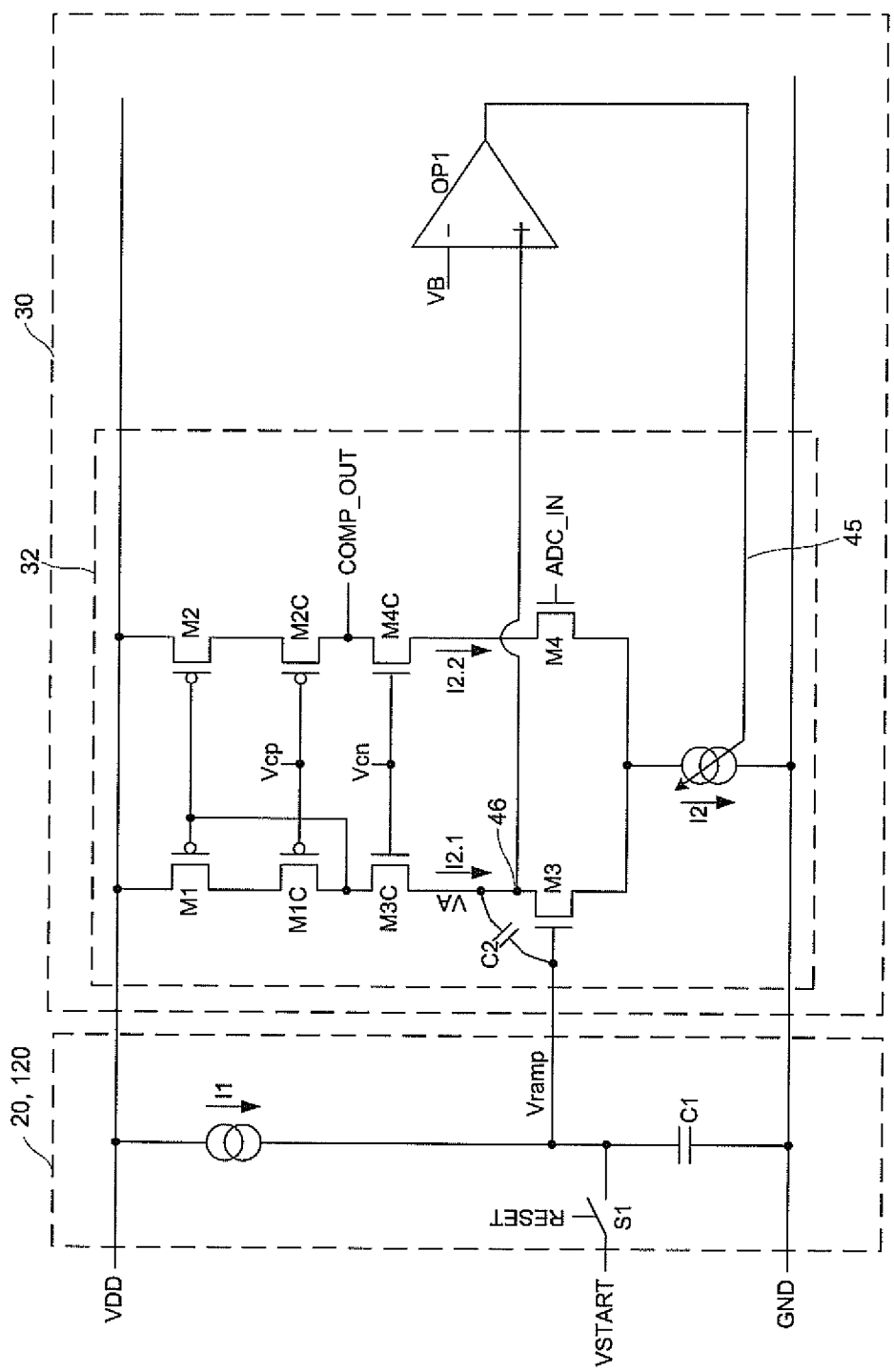

FIG. 7 shows another embodiment of the comparator 32 in which the gain of the comparator is increased by using cascode transistors (M1C, M2C, M3C and M4C). Inputs Vcn and Vcp in FIG. 7 serve to bias the cascode transistors M1C, M2C, M3C and M4C. They are generated by an auxiliary voltage reference circuit (not shown) which provides a constant voltage. Such auxiliary circuit can, for example, be provided by a digital-to-analog converter or derived from a voltage generated by a bandgap voltage reference circuit. This constant voltage increases the output resistance of the comparator. This increases the gain of the comparator.

Figure 8:
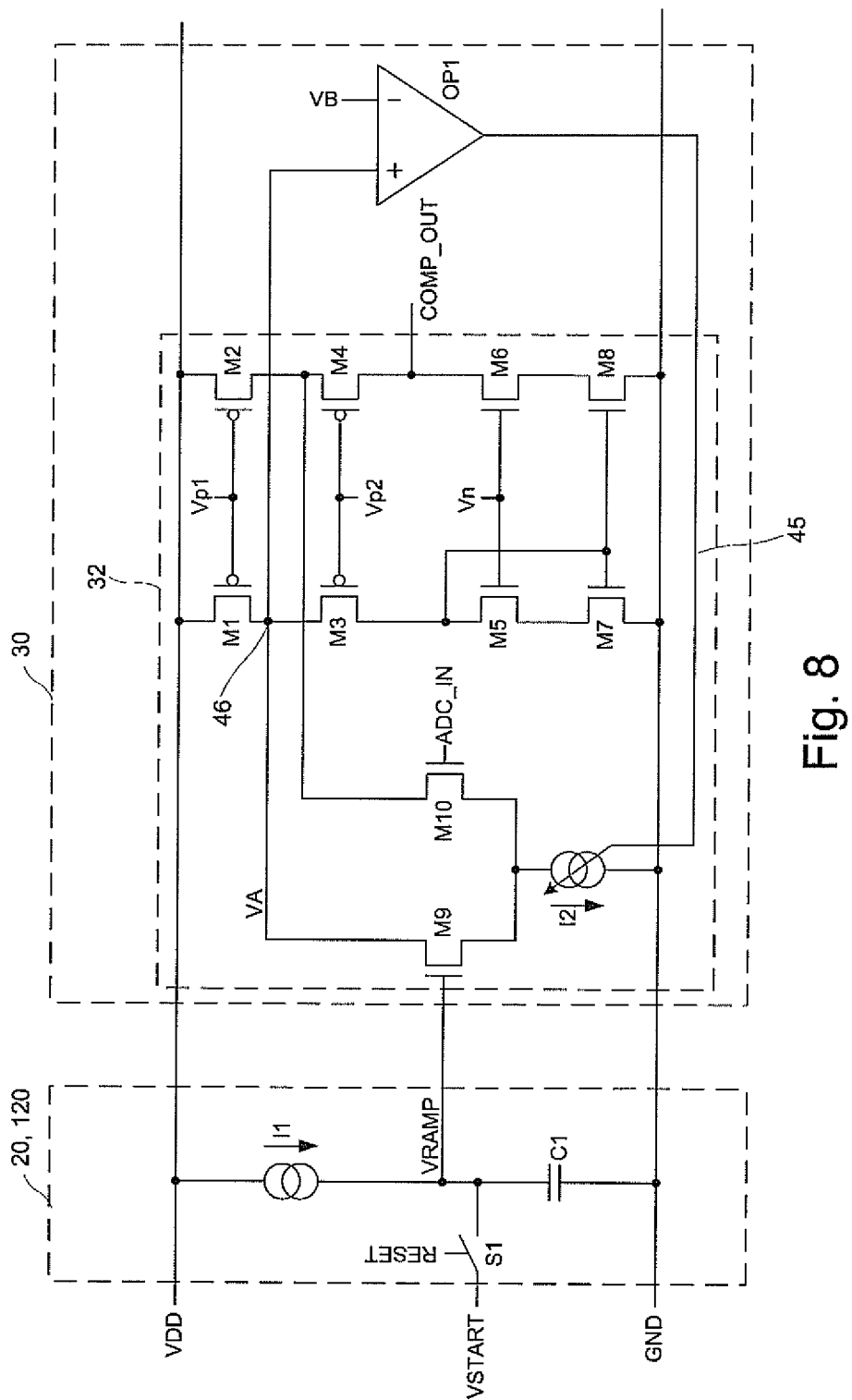

FIG. 8 shows another embodiment of the comparator 32 with a folded cascode configuration. The input voltages Vp1, Vp2 and Vn are reference DC voltages. These can be generated by an auxiliary voltage reference circuit (not shown) which provides a constant voltage. Such auxiliary circuit can, for example, be provided by a digital-to-analog converter or derived from a voltage generated by a bandgap voltage reference circuit. The auxiliary circuits for FIGS. 7 and 8 can be provided on the same chip as the ADC. The purpose of transistors M3, M4, M5 and M6 is to increase the output resistance and hence the gain of the circuit.

The operating principle of the comparators of FIGS. 7 and 8 is the same as previously described. A feedback loop comprising op amp OP1 with inputs VA and VB, and feedback signal 45 ensures that VA is equal to VB, regardless of the state of the comparator output. VB can be generated in the same manner as shown in FIGS. 4 and 6, or by any other suitable manner.

It has been described how a comparator compares analog input signal level ADC_IN with a ramp signal and generates an output based on the comparison. For analog-to-digital conversion apparatus which is connected to a pixel array, there can be two analog signal levels of interest: a reset voltage, Vres, and a signal voltage, Vsig. The reset voltage is a voltage of a pixel following reset. The signal voltage is a voltage of a pixel following exposure to light during an exposure period. The analog-to-digital converter can generate a separate digital output value for each of these analog signal levels, or it can generate a digital output value which is representative of a difference between these analog signal levels, e.g. (Vsig−Vres). Depending on what particular control scheme is used at the analog-to-digital converter, the digital output value may be a scaled version of (Vsig−Vres), or may include a known offset value which can be subtracted from the value obtained from the analog-to-digital converter to derive the difference (Vsig−Vres).

The control stage can serially (i.e. sequentially) compare the ramp signal with the first analog signal level and the second analog signal level, or the control stage can compare, in parallel, the ramp signal with the first analog signal level and the second analog signal level.

Some analog-to-digital converters for use with pixel arrays are described in EP 2 221 975 A2, U.S. Pat. No. 8,040,269, EP 2 109 223 A2, U.S. Pat. No. 8,253,616 and U.S. Pat. No. 7,880,662 features described in any of these patents, or patent applications, can be applied to embodiments of the analog-to-digital converters of the present invention.

In one control scheme, there are two cycles of the ramp signal. During a first cycle of the ramp signal Vres is compared with the ramp signal. During a second cycle of the ramp signal Vsig is compared with the ramp signal. The first cycle of the ramp signal can have a smaller amplitude range compared to the second cycle of the ramp signal, as Vres is expected to have a smaller range of possible values compared to Vsig. A counter can be enabled for different portions of the cycles of the ramp signal, based on comparison with Vres and Vsig and one or more of the start and end of the cycles of the ramp signal.

In another control scheme, there is one cycle of the ramp signal and, during the ramp signal Vres and Vsig are compared with the ramp signal. A counter can be enabled for one or more portions of the cycle of the ramp signal, based on comparison with Vres and Vsig.

Figure 9:
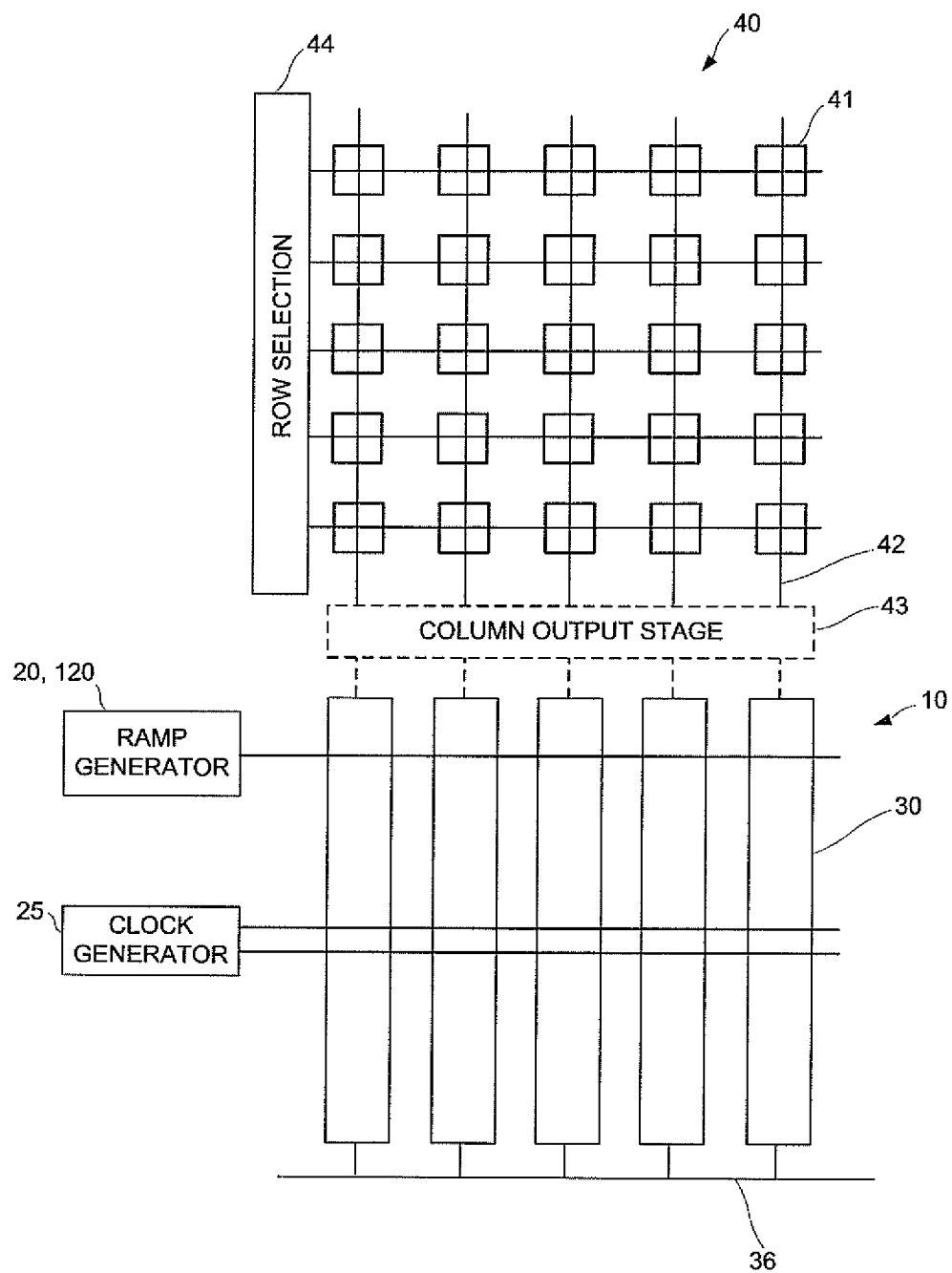
FIG. 9 shows an image sensor incorporating the analog-to-digital conversion apparatus.

FIG. 9 shows an image sensor comprising a pixel array 40 having a plurality of pixels 41. The pixels 41 can be arranged in a rectangular array of rows and columns of square/rectangular pixels. Alternatively, the pixels can be arranged in any other suitable pattern. Analog-to-digital conversion apparatus 10 as described above is provided for analog-to-digital conversion of outputs of the pixel array 40. A group of pixels, such as a column of pixels, share an output bus 42. An analog-to-digital converter 30 can be provided for each column of the pixel array 40. However, an analog-to-digital converter 30 can be provided for any other group of pixels, such as a row of pixels or a diagonal group of pixels. Another possible configuration is the use of two analog-to-digital converter per pixel column pitch. This allows to read out two rows of the pixel array in parallel. Another possibility is the use of one analog-to-digital converter per two columns and convert the pixels of a row in two successive steps, first converting the pixels on odd columns and then the pixels on even columns.

The set of analog-to-digital converters 30 can be operated in parallel with one another, thereby increasing the speed at which data can be read from the pixel array 40. A row selection circuit 44 controls which row of pixels of the pixel array 40 is read out. For example, rows can be selected one at a time, on a rotating basis. When a row is selected, a reset level and a signal level can be read from each pixel of the selected row, and output on column output bus 42. The values read from the pixel can be stored in a column output stage 43, such as a sample-and-hold stage.

The analog-to-digital conversion apparatus 10 can be provided on the same integrated circuit as the pixel array 40 and other parts of the image sensor. Alternatively, the analog-to-digital conversion apparatus 10 can be provided on a different integrated circuit to the pixel array 40 and/or other parts of the image sensor.

An advantage of the differential amplifier described above is that the input capacitance of the differential amplifier is independent of the state of the comparator. This can be beneficial for other topologies of column analog-to-digital converters used in CMOS image sensors.

Figure 10:
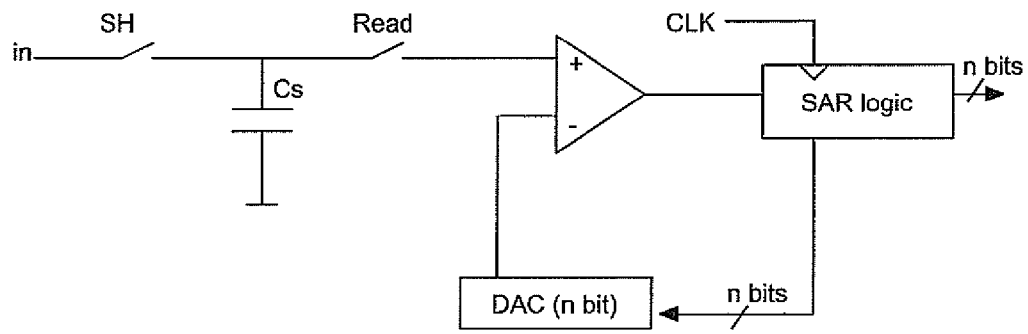
FIG. 10 shows a successive approximation ADC.

FIG. 10 shows a successive approximation ADC. The input (in) is connected to the output of a programmable gain amplifier in the column structure, or directly to the column bus of a pixel array. This signal is sampled on capacitor Cs before the AD conversion starts. When the AD conversion starts, the switch READ is closed and the sampled input signal is put on one comparator input. The output of a digital-analog converter (DAC) is put at the other comparator input. The output of the comparator is connected to a logic circuit that executes a search algorithm. A binary search algorithm is typically used. This allows conversion to n bits in n clock cycles. During the first comparison step, the input signal is compared to the middle value of the ADC range. This determines the most significant bit (or MSB). During the next clock cycle, the next bit is determined by comparing the input signal to ¾ or ¼ of the ADC input range, depending on the result of the MSB. After n clock cycles, n bits are determined. The input of the comparator is taken from the value sampled on capacitor Cs. The parasitic input capacitance of the comparator is added to this capacitance. The variation of input capacitance with comparator output state causes a non-linearity of the response of the ADC. The present invention avoids this source of non-linearity. As a comparator for the SAR ADC, the same circuit 30 as shown in FIG. 4 can be used. The input from the capacitor Cs and the READ switch is connected to the gate of M3 of this comparator. The gate of M4 is connected to the DAC. The circuit of FIG. 4 keeps the input capacitance at the gate of M3 at a constant value, independent of the state of the comparator output. This avoids distortion of the signal at the gate of M3. Alternatively the gate of M3 can be connected to the DAC. A DA converter can be made by a capacitive network. In that case, a change of gate input capacitance of the comparator should also be avoided. This can be achieved by the circuit of FIG. 4 as discussed.

FIG. 11 shows a cyclic ADC. FIG. 11a shows the block diagram of such ADC. At the first cycle of the operation, the signal is sampled on a sample-and-hold stage at the input. The output of a 1.5 bit DAC is subtracted from the signal and this residue is amplified by 2×. The result is compared to a 1.5 bit ADC stage. This ADC outputs a binary code 10, 00, or 01 depending on the input, as shown in FIG. 11b. The output of the 1.5 bit stage drives the DAC for the next cycle. The output is also stored in a register. This register collects the bit outputs for successive cycles and reconstructs a digital value. One cycle has a conversion transfer function as shown in FIG. 11b.

A simplified circuit implementation of such converter is shown in FIG. 11c. The 2× amplifier is implemented as a differential amplifier. The differential amplifier amplifies the signal by 2× compared to a common mode level ("com" in the figure). This differential amplifier should not change its input capacitance as a function of the polarity of the signal against the common mode level. Otherwise an error will be created, this error propagates through consecutive cycles of the AD conversion and results in a non-linearity of the ADC. The invention presented allows to design this amplifier without change of input capacitance, and improves linearity of the cyclic AD converter.

Figure 12:
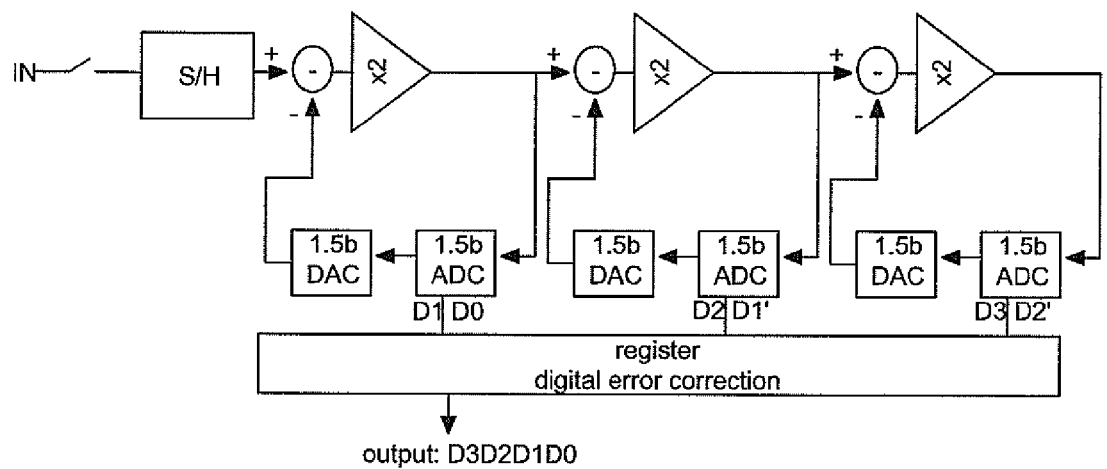
FIG. 12 shows a pipelined AD converter.

A similar principle can be employed to comparators used in a pipelined AD converter. Operation of the pipelined converter is similar to the cyclic converter, but circuit blocks are put in cascade, rather than being re-used for every stage as in the cyclic converter. A configuration of such pipelined AD converter is shown in FIG. 12.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term "comprising" is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the invention.

The invention claimed is:

1. An analog-to-digital conversion apparatus comprising:
   a plurality of analog-to-digital converters;
   a ramp generator which is arranged to generate a ramp signal for distribution to the plurality of analog-to-digital converters;
   wherein each of the analog-to-digital converters comprises:
      an analog signal input for receiving an analog signal level;
      a ramp signal input for receiving the ramp signal;
      a control stage which is arranged to compare the ramp signal with the analog signal level received at the analog signal input and, based on the comparison, to enable a counter provided at the analog-to-digital converter or to latch a digital value received from a counter, the control stage comprising:
         a comparator in the form of a first differential amplifier with a first branch connected to the input for receiving the ramp signal, a second branch connected to the analog signal input and an output;
         a variable biasing current source for biasing the first differential amplifier;
         a feedback circuit for controlling the variable biasing current source, wherein the feedback circuit comprises a second differential amplifier with a first input connected to a node on the first branch and a second input connected to a reference voltage such that the node on the first branch is maintained at a substantially constant voltage during all comparison states of the comparator.

2. An analog-to-digital conversion apparatus according to claim 1 wherein the first branch of the first differential amplifier comprises a first transistor connected in series with a second transistor, with the ramp signal input connected to a gate of the first transistor, and wherein the node on the first branch is between the first transistor and the second transistor.

3. An analog-to-digital conversion apparatus according to claim 1 wherein the second branch of the first differential amplifier comprises a third transistor connected in series with a fourth transistor, with the analog signal input connected to the third transistor, and wherein the output of the comparator is taken from a node on the second branch between the third transistor and the fourth transistor.

4. An analog-to-digital conversion apparatus according to claim 1 further comprising additional gain stages connected to the output of the first differential amplifier.

5. An analog-to-digital conversion apparatus according to claim 4 wherein the additional gain stages comprise:
   a second gain stage comprising a second gain stage transistor in series with a second gain stage current source;
   a third gain stage comprising a third gain stage transistor in series with a third gain stage current source;
   wherein an output of the first differential amplifier is connected to a gate of the second gain stage transistor and wherein the second gain stage is connected to a gate of the third gain stage transistor.

6. An analog-to-digital conversion apparatus according to claim 5 further comprising a reference circuit for providing the reference voltage, the reference circuit comprising a reference circuit current source, and wherein current values of the current sources are arranged such that a current value of the third gain stage current source is substantially twice a current value of the reference circuit current source, and a current value of the second gain stage current source is substantially equal to a current value of the reference circuit.

7. An analog-to-digital conversion apparatus according to claim 1 wherein the first branch and the second branch of the first differential amplifier comprise additional series connected transistors.

8. An analog-to-digital conversion apparatus according to claim 1 wherein the first differential amplifier comprises a folded cascode amplifier.

9. An analog-to-digital conversion apparatus according to claim 1 further comprising a reference circuit with a reference circuit current source in series with a reference circuit transistor, wherein the second input of the second differential amplifier connects to a node of the reference circuit between the reference circuit current source and the reference circuit transistor.

10. An analog-to-digital conversion apparatus according to claim 1 wherein the second differential amplifier is an operational amplifier.

11. An analog-to-digital conversion apparatus according to claim 1 wherein the analog signal input is arranged to receive a first analog signal level and a second analog signal level, and wherein the control stage is arranged to enable the counter based on a comparison of the ramp signal with the first analog signal level and the second analog signal level.

12. An analog-to-digital conversion apparatus according to claim 11 wherein the control stage is arranged to generate a digital output value which is representative of a difference between the first analog signal level and the second analog signal level.

13. An analog-to-digital conversion apparatus according to claim 11 wherein the first analog signal level is a reset level of a pixel and the second analog signal level is a signal level of the pixel following exposure.

14. An analog-to-digital conversion apparatus according to claim 1 wherein the control stage is arranged to enable the counter based on at least one of a start of a cycle of the ramp signal and an end of a cycle of the ramp signal.

15. An image sensor comprising an array of pixels and an analog-to-digital conversion apparatus according to claim 1, wherein each of the plurality of analog-to-digital converters in the analog-to-digital conversion apparatus is associated with a group of pixels in the array of pixels.

16. A method of performing analog-to-digital conversion at an analog-to-digital conversion apparatus comprising a plurality of analog-to-digital converters, the method comprising:

generating a ramp signal and distributing the ramp signal to the plurality of analog-to-digital converters;

and further comprising, at each of the analog-to-digital converters:

receiving an analog signal level;

receiving the ramp signal;

comparing the ramp signal with the analog signal level and, based on the comparison, enabling a counter provided at the analog-to-digital converter or latching a digital value received from a counter, wherein the comparison is performed by a comparator in the form of a first differential amplifier with a first branch connected to the input for receiving the ramp signal, a second branch connected to the analog signal input and an output;

and the comparing further comprises biasing the first differential amplifier with a variable biasing current and controlling the biasing by a feedback circuit comprising a second differential amplifier with a first input connected to a node on the first branch and a second input connected to a reference voltage such that the node on the first branch is maintained at a substantially constant voltage during all comparison states of the comparator.

* * * * *